US005493230A

United States Patent [19]
Swart et al.

[11] Patent Number: 5,493,230
[45] Date of Patent: Feb. 20, 1996

[54] RETENTION OF TEST PROBES IN TRANSLATOR FIXTURES

[75] Inventors: Mark A. Swart, Upland; Patrick R. Gocha, Anaheim Hills, both of Calif.

[73] Assignee: Everett Charles Technologies, Inc., Pomona, Calif.

[21] Appl. No.: 292,054

[22] Filed: Aug. 16, 1994

Related U.S. Application Data

[63] Continuation of Ser. No. 201,573, Feb. 25, 1994.

[51] Int. Cl.$^6$ ........................................ G01R 1/06
[52] U.S. Cl. .................... 324/754; 324/761; 324/73.1
[58] Field of Search .................... 324/73 PC, 754, 324/73.1, 761

[56] References Cited

U.S. PATENT DOCUMENTS

| | | | |
|---|---|---|---|
| 3,899,233 | 8/1975 | Sigel et al. | 324/72.5 |
| 3,906,363 | 9/1975 | Fowler | 324/73 PC |
| 4,061,969 | 12/1977 | Dean | 324/73 PC |
| 4,230,985 | 10/1980 | Matrone et al. | 324/73 PC |
| 4,322,682 | 3/1982 | Schadwill | 324/158 P |
| 4,344,033 | 8/1982 | Stowers | 324/158 F |
| 4,423,373 | 12/1983 | Le Croy, Jr. | 324/73 PC |
| 4,463,310 | 7/1984 | Whitley | 324/73 PC |
| 4,544,886 | 10/1985 | Murray et al. | 324/73 PC |
| 4,618,820 | 10/1986 | Salvagno et al. | 324/73 PC |
| 4,625,164 | 11/1986 | Golder | 324/158 F |
| 4,626,776 | 12/1986 | Wilkinson | 324/73 PC |
| 4,721,908 | 1/1988 | Driller et al. | 324/158 F |
| 5,252,916 | 10/1993 | Swart | 324/158 P |

FOREIGN PATENT DOCUMENTS

| | | | |
|---|---|---|---|
| 2915742 | 10/1980 | Germany | 324/158 P |
| 2933682 | 3/1981 | Germany | 324/73 PC |
| 2139019 | 10/1984 | United Kingdom | 324/158 F |
| WO8301688 | 5/1983 | WIPO | 324/158 P |

OTHER PUBLICATIONS

"Multiprobe Testing Device," by Eddy, IBM Tech. Disc. Bull. vol. 12, #4, Sep. 1969, p. 539.
"Test Chamber with Seal and Boot," by Bruder et al., IBM Tech. Disc. Bull., vol. 17, #1, Jun. 1974, pp. 92–93.

*Primary Examiner*—Kenneth A. Wieder
*Assistant Examiner*—Mark Wardas
*Attorney, Agent, or Firm*—Christie, Parker & Hale

[57] ABSTRACT

A translator pin retention system for a translator fixture for a printed circuit board tester having a pattern of test probes facing away from a base plate upon which the translator fixture is mounted. The fixture comprises a plurality of essentially parallel and spaced apart translator plates having patterns of preformed holes for containing and supporting straight, solid translator pins extending through the plates of the translator fixture for use in translating test signals between test points on a printed circuit board supported by the fixture and the test probes on the base of the tester. A thin, flexible pin retention sheet of an elastomeric material rests on one of the translator plates so that the translator pins that extend through the translator plate on which the sheet rests also extend through the pin retention sheet. The pin retention sheet has a preformed pattern of flexible slotted openings undersized with respect to the size of the translator pins which extend through the pin retention sheet so that the elastomeric properties of the pin retention sheet naturally apply a compression force around the translator pins to retain the pins in the fixture. The pin retention sheet is freely movable independently of the translator plate on which it rests so that the compression force acting on the pins essentially avoids drag forces or any restriction to axial movement of the pins within the fixture.

13 Claims, 2 Drawing Sheets

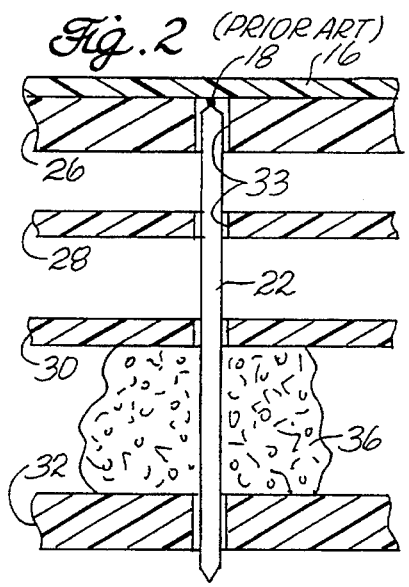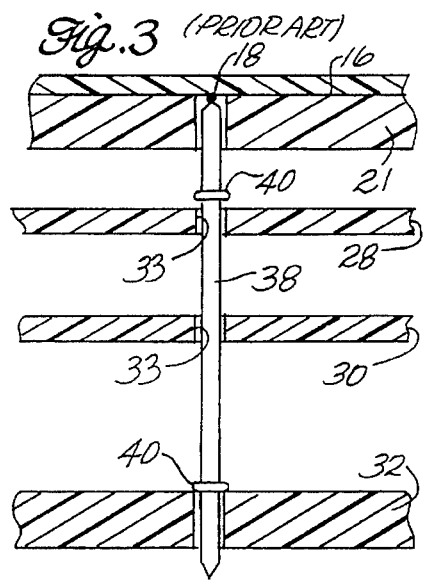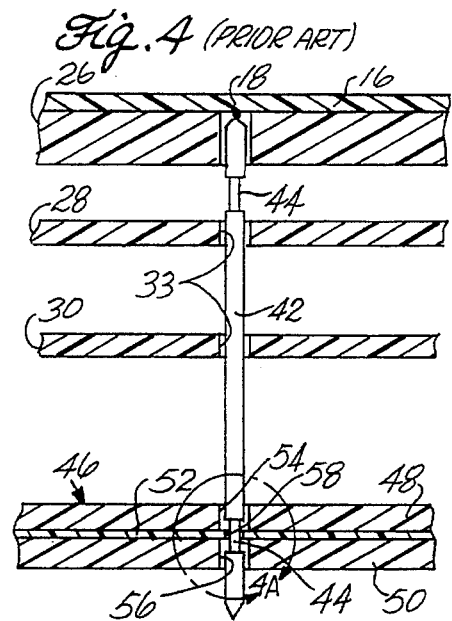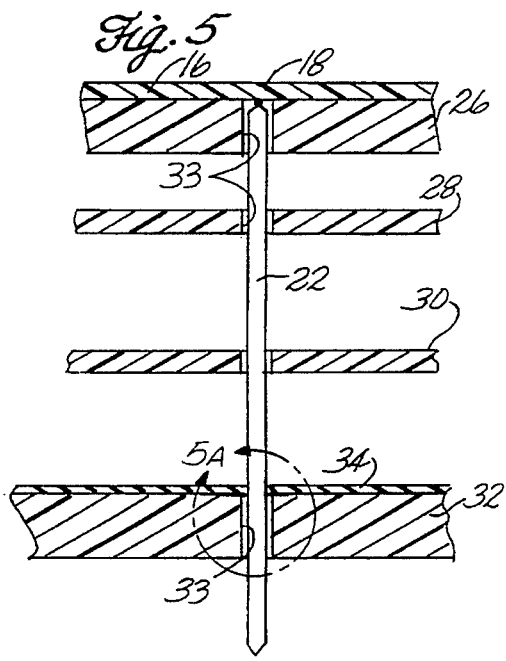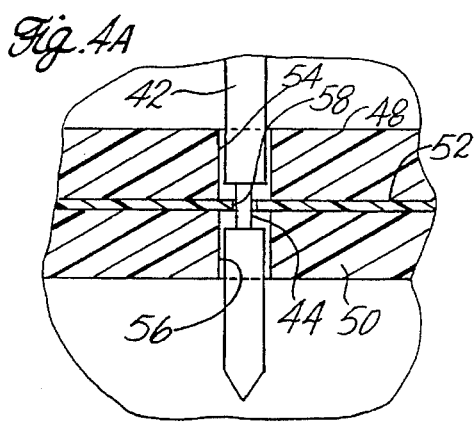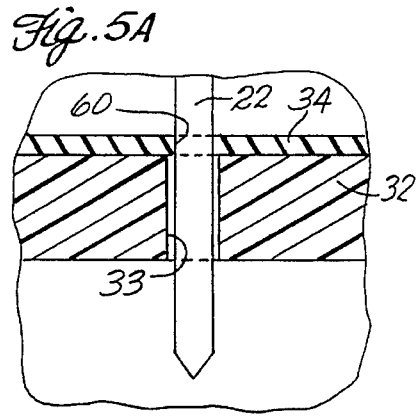

RETENTION OF TEST PROBES IN TRANSLATOR FIXTURES

CROSS-REFERENCE TO RELATED APPLICATION

This is a continuation of application Ser. No. 08/201,573, filed Feb. 25, 1994.

FIELD OF THE INVENTION

This invention relates to the automatic testing of printed circuit boards, and more particularly, to dedicated test fixtures of the type having test probes on a grid pattern, in which a translator fixture is used for translating test points from an off-grid pattern on a board under test to a grid base of the tester in which the test probes are on a standard grid pattern.

BACKGROUND OF THE INVENTION

Automatic test equipment for checking printed circuit boards has long involved use of a "bed of nails" test fixture in which the circuit board is mounted during testing. This test fixture includes a large number of nail-like spring-loaded test probes arranged to make electrical contact under spring pressure with designated test points on the circuit board under test, also referred to as the unit under test or "UUT." Any particular circuit laid out on a printed circuit board is likely to be different from other circuits, and consequently, the bed of nails arrangement for contacting test points in the board must be customized for that particular circuit board. When the circuit to be tested is designed, a pattern of test points to be used in checking it is selected, and a corresponding array of test probes is configured in the test fixture. This typically involves drilling a pattern of holes in a probe plate to match the customized array of test probes and then mounting the test probes in the drilled holes on the probe plate. The circuit board is then mounted in the fixture superimposed on the array of test probes. During testing, the spring-loaded probes are brought into spring-pressure contact with the test points on the circuit board under test. Electrical test signals are then transferred from the board to the test probes and then to the exterior of the fixture for communication with a high speed electronic test analyzer which detects continuity or lack of continuity between various test points in the circuits on the board.

Various approaches have been used in the past for bringing the test probes and the circuit board under test into pressure contact for testing. One class of these fixtures is a "wired test fixture" in which the test probes are individually wired to separate interface contacts for use in transmitting test signals from the probes to the external electronically controlled test analyzer. These wired test fixtures are often referred to as "vacuum test fixtures" since a vacuum is applied to the interior of the test fixture housing during testing to compress the circuit board into contact with the test probes. Customized wired test fixtures of similar construction also can be made by using mechanical means other than vacuum to apply the spring force necessary for compressing the board into contact with the probes during testing.

The wire-wrapping or other connection of test probes, interface pins and transfer pins for use in a wired test fixture can be time intensive. However, customized wired test fixtures are particularly useful in testing circuit boards with complex arrangements of test points and low-volume production boards where larger and more complex and expensive electronic test analyzers are not practical.

As mentioned previously, the customized wired test fixtures are one class of fixtures for transmitting signals from the fixture to the external circuit tester. A further class of test fixtures is the so called "dedicated" test fixtures, also known as a "grid-type fixture," in which the random pattern of test points on the board are contacted by translator pins which transfer test signals to interface pins arranged in a grid pattern in a receiver. In these grid-type testers, fixturing is generally less complex and simpler than in the customized wired test fixtures; but with a grid system, the grid interfaces and test electronics are substantially more complex and costly. It is the grid-type testers to which the present invention is directed.

A typical dedicated or grid fixture contains test electronics with a huge number of switches connecting test probes in a grid base to corresponding test circuits in the electronic test analyzer. In one embodiment of a grid tester as many as 40,000 switches are used. When testing a bare board on such a tester, a translator fixture supports translator pins that communicate between a grid pattern of test probes in a grid base and an off-grid pattern of test points on the board under test. In one prior art grid fixture so-called "tilt pins" are used as the translator pins. The tilt pins are straight solid pins mounted in corresponding pre-drilled holes in translator plates which are part of the translator fixture. The tilt pins can tilt in various orientations to translate separate test signals from the off-grid random pattern of test points on the board to the grid pattern of test probes in the grid base.

In the past, there has been a need to provide a means of retaining the translator pins in the translator fixture. As mentioned, the fixture typically consists of several parallel translator plates with patterns of drilled holes for retaining a large number of pins extending through the translator plates. The holes drilled in the translator plates are typically drilled at diameters that are slightly oversized with respect to the diameter of the pins, so that the pins may be easily inserted into the holes in the various plates of the translator fixture. The means of retaining the pins in the translator fixture is necessary to prevent the pins from falling out of the fixture if the fixture is lifted up and/or turned upside down without supporting the bottoms of the pins.

There are several prior art approaches to retaining the translator pins in a translator fixture. One approach has been to insert a compressible plastic foam cushion into the space between a pair of plates on the translator fixture. The plastic foam cushion may comprise an open-cell polyurethane foam. The pins are pushed through the plastic foam and, in use, the foam cushion naturally applies a compressible lateral retaining force that holds the pins in place. This approach allows use of straight solid pins which have advantages of tighter spacing capabilities, low manufacturing cost, good probe deflection, and bi-directional use of the pins. However, disadvantages of this approach include the fact that the foam deteriorates over time, drag force from the plastic foam cushion reduces the compliancy of the translator pin force, and the foam cushion is unduly stiffened if translator pin density is high.

Another retention system consists of specially formed translator pins in which each pin has a pair of longitudinally spaced apart enlarged annular rings that project outwardly around the circumference of the pin. The pins are inserted in the translator fixture when the translator plates are assembled. When assembly of the fixture is completed, the rings on the pins are located inboard from the outer translator plates so that the rings can act as stops in preventing the pins from slipping out of the fixture if the fixture is either lifted up or turned upside down. This arrangement has several disadvantages. The projecting rings on each probe reduce the capability of close spacing of the translator pins which can be undesirable if translator pin density must be increased to match a tight density spacing of test points. Further, the translator fixture must be disassembled in order to remove the translator pins each time the pins in the fixture are reconfigured, or for serviceability.

In a more recent approach to the problem, a thin sheet of plastic film such as polyethylene terephthalate (sold under the trademark Mylar) is used as the pin retainer. The Mylar sheet is embedded in the lower translator plate, and undersized holes are drilled in the Mylar sheet in alignment with the larger diameter holes in the translator plates. In addition, undercuts must be formed near the opposite ends of the translator pins, so that when the translator pins are inserted into the fixture, the undercuts are aligned with the undersized holes in the Mylar sheet. The enlarged sections of the pin on opposite sides of the undercut act as stops to prevent the probes from slipping out of the fixture. The undersized holes in the Mylar film act as a retainer and otherwise center the pin in the fixture. The advantage of this approach over use of the foam cushion is that no lateral drag forces are produced by the Mylar film. However, a disadvantage is that it requires specially formed translator pins with undercuts, which greatly increases manufacturing costs when compared with straight solid pins, because of the requirement of grinding the undercuts in each pin.

Other prior art pin retention systems include a fixture having rigid pins with variable diameter sections so that the translator plates can act as stops for the enlarged-diameter sections of the pins. In another fixture an enlarged ring at the bottom of the translator pin fits into openings within a two-part bottom plate that captures a lower portion of the pin within holes in the plates that act as stops on both sides of the ring. Both of these fixtures have the disadvantages that the probes are more expensive, probe deflection is reduced, there is added cost to the fixture, the pins are not bi-directional, pin loading time is greater, and the fixture requires disassembly for reconfiguring the pins or for serviceability. In addition, the fixture requiring the rigid pins with the variable diameter sections adds to the cost of pre-drilling the various holes in the translator plates.

The present invention provides a system for retaining translator pins in a translator fixture that overcomes the disadvantages of the described prior art retention systems. The invention has the advantage that standard straight solid translator pins can be used as opposed to specially formed pins. This greatly reduces the cost of the test fixture as well as ensuring the fixture's ability to match high density patterns of test points. In addition, the invention avoids the problems of drag forces or any other external forces that may otherwise reduce the compliancy force of the translator pins during use. The invention is extremely low in cost and easily adapted to use with all designs of translator fixtures.

SUMMARY OF THE INVENTION

Briefly, one embodiment of this invention comprises a translator pin retention system for a translator fixture for a printed circuit board tester having a pattern of test probes facing away from a base plate upon which the translator fixture is mounted. The fixture comprises a plurality of essentially parallel and spaced apart translator plates having patterns of preformed holes for containing and supporting translator pins extending through the plates of the translator fixture for use in translating test signals between test points on a printed circuit board supported by the fixture and the probes on the base of the tester. A thin, flexible pin retention sheet comprising an elastomeric material is positioned to rest on a surface of one of the translator plates so that the translator pins that extend through the translator plate on which the sheet rests also extend through the pin retention sheet. The pin retention sheet has a preformed pattern of openings having a size with respect to the size of the translator pins which extend through them that causes the elastomeric properties of the pin retention sheet around the openings to naturally apply a compression force around the translator pins. This compression force retains the pins in the fixture when the fixture is lifted or turned upside down. The pin retention sheet is movable independently of the translator plate on which it rests so that the compression force acting on the pins allows the pins to move with the retention sheet independently of the other pins and the pin supporting plates of the fixture. This essentially avoids drag forces or any restriction to compliant axial movement of the pins within the fixture.

Thus, the invention provides a translator pin retention system having the advantages of use with straight solid pins while the retention system avoids applying drag forces to the translator pins during use. If the pin moves, the elastomeric sheet moves with it, which avoids drag forces. Use of the straight solid pins also provides advantages of tighter spacing capabilities, maximum probe deflection capabilities, fixture reconfiguration and serviceability without disassembly of the fixture, and taking advantage of the bi-directional nature of the translator pins. In addition, fixture loading time is reduced. The cost of the translator pins also is reduced, when compared with the various translator pins of the prior art that require reconfiguring the design of the translator pins, which adds greatly to the cost of the fixture.

These and other aspects of the invention will be more fully understood by referring to the following detailed description and the accompanying drawings.

BRIEF DESCRIPTION OF THE DRAWINGS

FIGS. 2, 3 and 4 illustrate various prior art approaches to providing retention means for translator pins contained in a translator fixture for use in a grid-type test fixture. FIG. 4A is an enlarged view taken within the circle 4A of FIG. 4.

FIG. 5 is a semi-schematic cross-sectional view illustrating a translator pin retention means in a translator fixture according to principles of this invention. FIG. 5A is an enlarged view taken within the circle 5A of FIG. 5.

DETAILED DESCRIPTION

Figure 1:
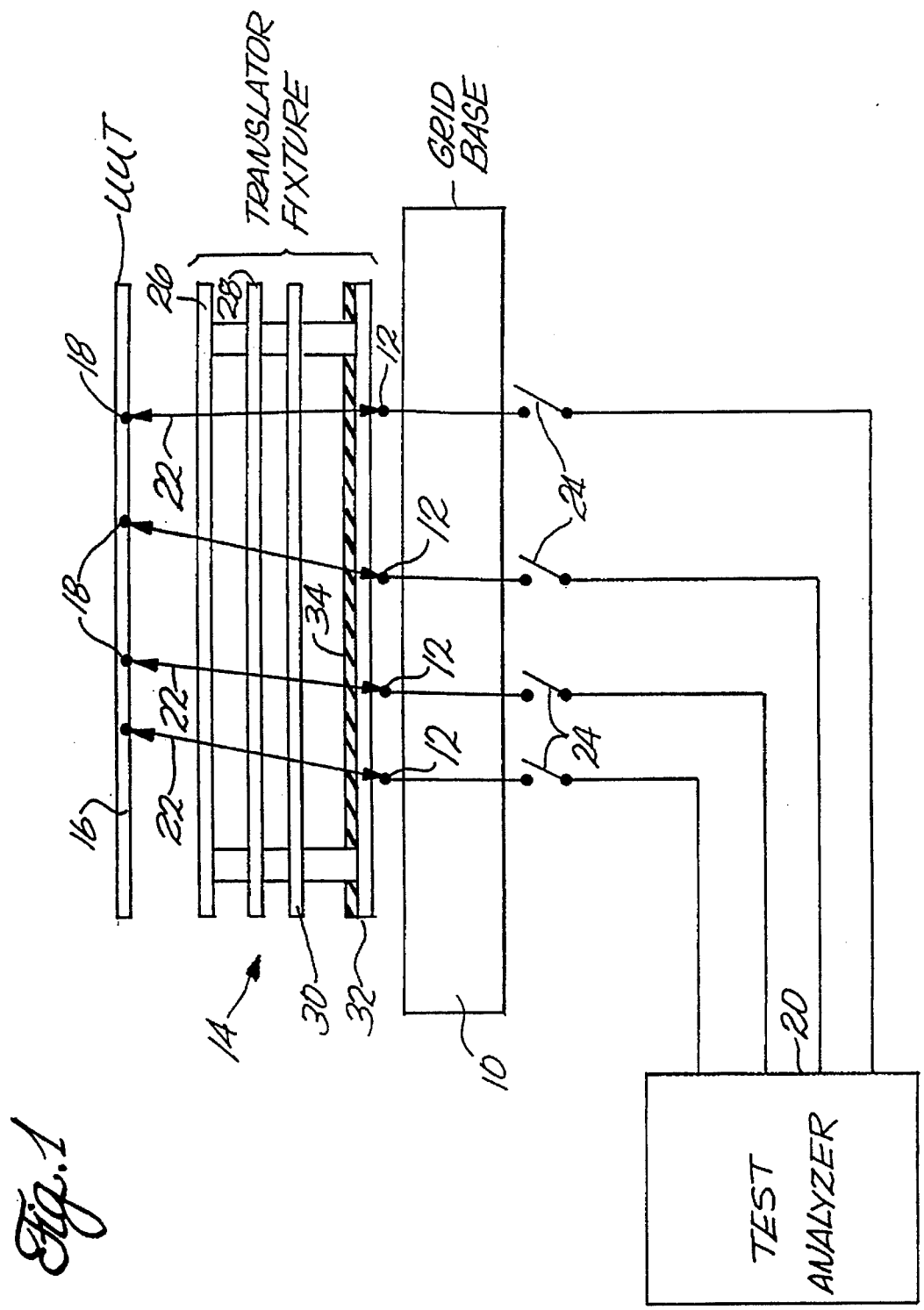
FIG. 1 is a schematic block diagram illustrating components of a dedicated or grid-type tester and a translator fixture with pin retention means according to principles of this invention.

Referring to the schematic block diagram of FIG. 1, a grid-type printed circuit board tester includes a grid base 10 having an array of spring-loaded test probes 12 arranged on a two-dimensional grid pattern. The test probes illustrated schematically in FIG. 1 preferably comprise an orthogonal array of uniformly spaced-apart rows and columns of test probes which may be aligned on 100 mil centers as an example. The spring-loaded plungers of the test probes 12 project above the surface of the grid base uniformly across the array of probes. A translator fixture 14 supports a printed circuit board 16 under test (also referred to as a "unit under test" or "UUT"). A translator fixture serves as an interface between an array of test points 18 on the board under test and the test probes 12 in the grid base 10. An external electronic test analyzer 20 is electrically connected to the test points in the board under test through test probes in the translator fixture. These test probes (of which there can be several types) are illustrated generally at 22.

The test analyzer 20 contains electronic interrogation circuits to electronically interrogate separate test points 18 of the board under test in order to determine whether or not an electrical connection exists between any two given test points. The electrical connections detected between test points on the tested board are electronically compared with stored reference results obtained from a previous interrogation of test points of a faultless master printed circuit board. The tested board is good if test results match the stored reference results, but if any problem exists in the circuits on the board, the problem is detected by the test results and the bad boards then can be separated from the good boards.

Electronic interrogation circuits in one embodiment comprise the plurality of printed circuit cards (sometimes called "switch cards") having electronic components and printed circuits for carrying out the electronic testing. Each test probe used in the test procedure is represented as being coupled to the test electronics through a corresponding switch 24 leading to the test analyzer. In a given grid-type tester there can be as many as 40,000 switches available for testing the various test points in a board under test.

The translator fixture 14 includes a series of vertically spaced-apart and parallel translator plates which may include a top plate 26, an upper plate 28 spaced a short distance below the top plate, a lower plate 30 at approximately an intermediate level of the translator fixture, and a base plate 32 at the bottom of the translator fixture. The translator plates are supported in parallel vertically spaced apart positions by rigid posts 35 that hold the fixture together as a rigid unit. The fixture also includes an array of standard translator pins such as tilt pins represented schematically at 22 extending through the translator plates 26, 28, 30 and 32. FIG. 1 illustrates only a few of the standard tilt pins for simplicity. The tilt pins extending through the base plate 32 of the translator fixture are in alignment with the grid pattern of test probes 12 in the grid base 10. The top portions of the tilt pins, which extend through the top plate 26, are in an off-grid pattern aligned to match the random pattern of test points 18 on the UUT. Thus, the tilt pins can be tilted slightly and various three dimensional orientations that can be used in order to translate between the grid pattern at the base and the off-grid pattern at the top. The standard tilt pins pass through holes in the base plate, through holes in the lower and upper plates, and through a hole pattern in the top plate. The holes in each of the translator plates (represented by reference numerals 33) are drilled in patterns controlled by standard computer-operated software according to well-known procedures for aligning the tilt pins in the various orientations to translate between the grid pattern at the base and the off-grid pattern at the top. The tilt pins extend through a flexible pin retention sheet 34 comprising a common sheet of a thin, flexible elastomeric material that overlies the top face of the base plate of the translator fixture. The pin retention sheet 34 is described in more detail below, and in order to better appreciate the improvements provided by the pin retention sheet 34, reference is first directed to the prior art pin retention systems shown in FIGS. 2 through 4. These figures represent examples of the prior art; additional prior art pin retention systems are described in the background section of this application.

FIG. 2 illustrates a translator fixture having straight solid conductive tilt pins 22 for translating test signals from test points 18 on a board 16 under test to spring probes in a grid base (not shown) located below the pins 22. The FIG. 2 embodiment includes an open-cell resilient plastic foam material such as polyurethane foam in the form of a thick compressible cushion 36 extending across the space between the lower plate 30 and the base plate 32 of the translator fixture. The tilt pins 22 are inserted through the oversized pre-drilled holes 33 in the translator plates of the fixture and also through the depth of the flexible plastic foam cushion 36. (The holes 33 in the translator plates are shown exaggerated in size in FIGS. 2–5 for clarity.) The cushion 36 is not pre-drilled with holes to receive the tilt pins. The pins by extending straight through the cushion without pre-drilling causes the resilient foam material to naturally compress around the sides of the tilt pins along the space between the lower translator plate and the base plate of the fixture. This provides a constant resilient means of applying a pin retaining force in the space between the two lower plates of the fixture. As mentioned previously, this prior art system allows the use of straight solid pins which is advantageous, but the plastic foam material deteriorates over time, drag forces reduce the compliancy of the spring force provided by the translator pins, and the pins can stiffen the foam material if pin density is high.

FIG. 3 illustrates a prior art pin retention system which includes specially formed tilt pins 38 having enlarged outwardly projecting annular rings 40 near opposite ends of the tilt pins. The pins are inserted into the fixture when the translator plates are assembled, and the pins extend through the oversized holes in the translator plates. The rings 40 act as stops by engaging the inside faces of either the base plate 32 or the top plate 26 when the translator fixture is either lifted up or turned upside down. The rings on the pin engage the contact surfaces under gravity. This approach to pin retention avoids the problem of the FIG. 2 embodiment in that no drag forces are applied to the pins during use, but the specially formed pins 38 are more costly to manufacture when compared with straight solid pins. Moreover, the annular rings occupy lateral space that reduces the pins ability of being spaced closely to match a high density pattern of test points. The specially formed pins also require that the fixture must be disassembled in order to remove the pins and to reconfigure them for different patterns of test points.

FIG. 4 illustrates a more recent approach in a pin retention system which includes use of specially formed tilt pins 42. In this embodiment the tilt pins are ground down in the manufacturing process to produce undercuts 44 near opposite ends of the pins. The specially formed pins 42 extend through oversized holes in a hole pattern drilled in the various translator plates of the translator fixture. This embodiment, however, requires a specially constructed base plate 46 of the translator fixture which includes top and bottom sheets 48 and 50 of a rigid plastic material such as Lexan and a thin sheet of polyethylene terephthalate (such as the plastic film sheet sold under the trademark Mylar) 52 sandwiched between the sheets 48 and 50. The embodiment of FIG. 4 shows oversized pre-drilled holes 54 and 56 drilled in alignment for receiving the lower portion of the specially formed translator pin 42. The Mylar sheet is pre-drilled with holes 58 aligned with the holes 54 and 56 but with much smaller diameters that are slightly oversized with respect to the outside diameter of the undercut 44. This embodiment allows the specially formed translator pins 42 to be inserted into the fixture through the pre-drilled holes in the translator plates with the lower portion of the pins being pushed through the Mylar film 52 so that the undercut portion 44 of each pin engages a corresponding undersized hole 58 in the Mylar film. The Mylar film is relatively stiff and essentially inelastic axially (within the plane of the film) and is held in a rigid position by the upper and lower plates 48 and 50 of the base plate in the translator fixture. The Mylar film centers the pin and acts as a pin retainer and also has the advantage of producing essentially no drag forces on the pins during use. However, the manufacturing costs of making the pins with the undercuts is extremely expensive compared to use of straight solid pins.

The pin retention system of the present invention, as shown best in FIG. 5, comprises the flexible elastomeric sheet 34 overlying the upper face of the lower translator base plate 32 of the translator fixture. Slightly oversized holes are drilled in the translator plates 26, 28, 30 and 32 for aligning the tilt pins 22. The pin retention sheet 34 preferably comprises a thin, flat, flexible sheet of a closed-cell rubber material which can comprise either synthetic rubber or natural rubber. The preferred rubber is a latex rubber which can comprise both natural and synthetic latex. The elastomeric sheet is useful for its capability of applying a resiliently compressible force to the pins 22. A sponge-like open-cell material is not desirable because the compression force applied to the pins may be inadequate as a pin retention device. The fixture is assembled by overlaying the latex sheet 34 on the top face of the base plate 32 of the translator fixture, allowing the latex sheet 34 to rest on the top face of the base plate without being adhered to the base plate. The flexible elastomeric sheet is particularly free from adherence to the base plate in the areas where the pins 22 pass through the sheet. The flexible elastomeric sheet is therefore freely movable with the pins toward or away from the base plate. Maximum pin travel free of drag forces is equal to the distance between the base plate 32 and the lower plate 30. Openings 60 are first drilled in the latex rubber sheet to match the pattern of holes drilled through the bottom translator plate (the base plate 32). The pins are then inserted in the openings 60. The openings drilled in the latex sheet are undersized with respect to the outside diameter of the tilt pins 22, whereas the holes 33 in the base plate 32 are slightly oversized with respect to the outside diameter of the tilt pins. The openings 60 in the rubber sheet are drilled by a standard drill bit which does not form a circular hole in the rubber, but instead forms a generally S-shaped slotted opening (referred to as an irregularly shaped slotted opening). As the drill bit spins, it slices the rubber and the rubber moves away, leaving the generally S-shaped opening with flexible resilient flaps on opposite sides. The flaps resiliently cling to the sides of the pins to produce the resiliently compressible retention force that holds the pins in place. The openings 60 are considered undersized with respect to the outside diameter of the pins because the cross sectional open area of the generally S-shaped slotted openings is less than the cross-sectional area of the pin. Preferably, the pin retention sheet comprises a flexible sheet of natural latex closed-cell elastomeric rubber having a thickness from about 0.020 to about 0.040 inch, more preferably having a thickness of about 0.030 inch.

Advantages of using the pin retention sheet of this invention are that the elastomeric latex rubber material has high tear resistance, good memory (recovery force), and is a reasonably inexpensive material. During use, the elastic material also produces a good level of retention force laterally on the sides of the pins 22 sufficiently to hold the pins in place in the fixture, independently of any other structural component of the fixture. The retention sheet is also free to move up or down with movement of the pins, such as when adjacent pins contact adjacent pads of different height on a PCB. (A common variation in height may be from 0.010 to 0.015 inch.) Therefore, the flexible sheet can flex freely without adding any drag forces to the pins.

Inasmuch as the fixture can use straight solid pins, as opposed to specially formed pins, the translator pins are much less expensive, and there is no requirement to disassemble the components of the translator fixture in order to reconfigure the tilt pins. The tilt pins can simply be removed from the translator fixture and reconfigured by pulling them out of the pre-drilled openings 60 in the elastomeric sheet and pushing them into other openings when reconfiguring the pins. Insert cycles can be very high because of the material's ability to resist tearing. Use of the elastomeric sheet also allows independent movement of one pin next to another pin without affecting travel of adjacent translator pins. The freely movable elastomeric sheet holds each pin in place but also allows each pin to move with an independent compliant force and with essentially no drag forces. Thus, the independent compliance of each of the tilt pins is unaffected by the retention sheet.

When pre-drilling the openings 60 in the retention sheet 34, the preferred arrangement is to position the material in a drilling machine with tooling holes engaging tooling pins for holding the sheet in place while the undersized openings 60 are pre-drilled on the grid pattern that matches the pattern of probes 12 in the grid base 10 of the tester. In one embodiment, a drill bit having a diameter of about 0.039 inch is used to drill slotted openings 60 for tilt pins having diameters of 0.019, 0.023 and 0.031 inch. This size drill bit, or one in the range of about 0.035 to 0.045 inch, is sufficient to produce openings having a good level of retention force that is not too strong to produce drag forces and not too weak to produce the necessary level of retention.

What is claimed is:

1. A translator pin retention system for a translator fixture for a printed circuit board tester having a pattern of test probes facing away from a base upon which the translator fixture is mounted, the translator fixture comprising a plurality of essentially parallel and spaced apart rigid translator plates supported in a fixed position in the translator fixture and having selected patterns of holes aligned in the translator plates for containing and supporting translator pins extending through the plates of the translator fixture for positioning the translator pins for contacting test points on the printed circuit board which is supported at one end of the test fixture and for translating electrical test signals between the test points on the printed circuit board and the test probes on the base of the tester, the translator fixture including a thin, flexible rubber pin retention sheet positioned between an adjacent pair of said translator plates and positioned to rest loosely adjacent to and unattached to a surface of one of said pair of translator plates in the area of the translator pins so that the translator pins that extend through said pair of translator plates also extend through the pin retention sheet, the translator pins comprising straight, solid pins, the pin retention sheet having a preformed pattern of openings which are undersized with respect to the outside diameter of the translator pins which extend through the pin retention sheet so that the elastomeric properties of the rubber pin retention sheet naturally apply a resilient compression force around the circumference of the translator pins extending through the sheet at a level sufficient to retain the translator pins within the test fixture, the pin retention sheet being freely movable independently of the translator plates so that the compression force of the rubber acting on the pins essentially avoids applying drag forces or any restriction to axial movement of the pins within the fixture.

2. Apparatus according to claim 1 in which the pin retention sheet comprises a thin flexible sheet of natural or synthetic latex rubber.

3. Apparatus according to claim 2 in which the latex rubber sheet has a thickness in the range of about 0.020 to 0.040 inch.

4. Apparatus according to claim 1 in which the pin retention sheet is mounted on top of a base plate of the translator fixture having a preformed hole pattern slightly oversized with respect to the size of the translator pins extending through the base plate and drilled on a grid pattern matching a grid pattern of the test probes on the grid base of the tester, and in which the pattern of undersized holes preformed in the pin retention sheet is aligned with the holes in the base plate of the translator fixture to match the same grid pattern.

5. Apparatus according to claim 4 in which the pin retention sheet comprises a thin, flexible sheet of natural or synthetic latex rubber.

6. Apparatus according to claim 5 in which the latex rubber sheet has a thickness in the range of about 0.020 to 0.040 inch.

7. Apparatus according to claim 6 in which the openings formed in the flexible sheet are slotted openings with resiliently flexible flaps that apply individual compression forces to the pins.

8. Apparatus according to claim 1 in which the openings formed in the flexible sheet are slotted openings with resiliently flexible flaps that apply individual compression forces to the pins.

9. A translator pin retention system for a translator fixture for a printed circuit board tester having a pattern of test probes facing away from a base upon which the translator fixture is mounted, the translator fixture comprising a plurality of essentially parallel and spaced apart rigid translator plates supported in a fixed position in the translator fixture and having selected patterns of holes aligned in the translator plates for containing and supporting translator pins extending through the plates of the translator fixture for positioning the translator pins for contacting the test points on the printed circuit board which is supported at one end of the test fixture and for translating electrical test signals between test points on the printed circuit board and the test probes on the base of the tester, the translator fixture including a thin, flexible rubber pin retention sheet positioned between an adjacent pair of said translator plates and positioned to rest loosely adjacent to and unattached to a surface of one of said pair of translator plates in the area of the translator pins so that the translator pins that extend through said pair of translator plates also extend through the pin retention sheet; the pin retention sheet being sufficiently thin in wall thickness to have both lateral and longitudinal flexibility; the translator pins comprising straight, solid pins; the pin retention sheet having a preformed pattern of openings which are undersized with respect to the outside diameter of the translator pins which extend through the pin retention sheet so that the elastomeric properties of the rubber pin retention sheet naturally apply a resilient compression force around the circumference of the translator pins extending through the sheet at a level sufficient to retain the translator pins within the test fixture; the pin retention sheet being freely movable independently of the translator plates so that the compression force of the rubber acting on the pins essentially avoids applying drag forces or any restriction to axial movement of the pins within the fixture.

10. Apparatus according to claim 9 in which the pin retention sheet has a thickness from about 0.020 to about 0.040 inch.

11. Apparatus according to claim 10 in which the pin retention sheet comprises natural or synthetic latex rubber.

12. A translator pin retention system for a translator fixture for a printed circuit board tester having a pattern of test probes facing away from a base upon which the translator fixture is mounted, the translator fixture comprising a plurality of essentially parallel and spaced apart rigid translator plates supported in a fixed position in the translator fixture and having selected patterns of holes aligned in the translator plates for containing and supporting translator pins extending through the plates of the translator fixture for positioning the translator pins for contacting test points on the printed circuit board which is supported at one end of the test fixture and for translating electrical test signals between the test points on the printed circuit board and the test probes on the base of the tester; the translator fixture including a thin, flexible pin retention sheet comprising an elastomeric material positioned between an adjacent pair of said translator plates and positioned to rest loosely adjacent to and unattached to a surface of one of said pair of translator plates in the area of the translator pins so that the translator pins that extend through the translator plates also extend through the pin retention sheet; the pin retention sheet comprising a closed cell rubber material sufficiently thin in wall thickness to have both lateral and longitudinal flexibility; the translator pins comprising straight, solid pins; the pin retention sheet having a preformed pattern of openings which are undersized with respect to the outside diameter of the translator pins which extend through the pin retention sheet so that the elastomeric properties of the rubber pin retention sheet naturally apply a resilient compression force around the circumference of the translator pins extending through the sheet at a level sufficient to retain the translator pins within the test fixture; the pin retention sheet being freely movable independently of the translator plates so that the compression force of the rubber acting on the pins essentially avoids applying drag forces or any restriction to axial movement of the pins within the fixture.

13. Apparatus according to claim 12 in which the pin retention sheet comprises natural or synthetic latex rubber having a sheet thickness from about 0.020 to about 0.040 inch.

* * * * *